United States Patent [19]

Kojima et al.

[11] 4,288,521
[45] Sep. 8, 1981

[54] PROCESS FOR THE PRODUCTION OF PHOTOSENSITIVE PLATES FOR PRINTING

[75] Inventors: Hiroshi Kojima; Kunio Ito; Masami Akiyama; Takeshi Tanaka, all of Hino, Japan

[73] Assignee: Konishiroku Photo Industry Co., Ltd., Tokyo, Japan

[21] Appl. No.: 115,122

[22] Filed: Jan. 24, 1980

[30] Foreign Application Priority Data

Jan. 30, 1979 [JP] Japan .................................. 54/9818

[51] Int. Cl.³ .............................................. G03C 1/76
[52] U.S. Cl. .................................. 430/169; 430/273;
430/141; 430/162; 430/155; 430/327; 430/330;
430/396; 430/961; 430/950; 430/523; 430/300;
430/302; 430/307; 430/349; 430/935; 427/180;
427/189; 427/194; 427/202
[58] Field of Search ............... 430/141, 162, 155, 327,
430/330, 273, 396, 961, 950, 523, 300, 302, 307,
349, 935, 168–169; 427/180, 189, 194, 202;
118/308, 60, 68

[56] References Cited

U.S. PATENT DOCUMENTS

| 3,118,459 | 1/1964 | Stumf | 118/308 |
| 3,359,128 | 12/1967 | Humphrey et al. | 427/180 |
| 3,687,703 | 8/1972 | Ohashi et al. | 430/950 |
| 4,168,979 | 9/1979 | Okishi et al. | 430/273 |

Primary Examiner—Won H. Louie, Jr.
Attorney, Agent, or Firm—Frishauf, Holtz, Goodman & Woodward

[57] ABSTRACT

There is provided a process for the production of a photosensitive plate for printing which comprises providing a given amount of a fine powder having a constant directional size of 0.5–40 $\mu$ from a dust supplier directly or via a distributor to a cyclone, feeding the said powder together with a small volume of air from the bottom of said cyclone, uniformly dispersing and adhering the so-flowed fine powder onto the surface of a continuously running photosensitive plate for printing.

6 Claims, 7 Drawing Figures

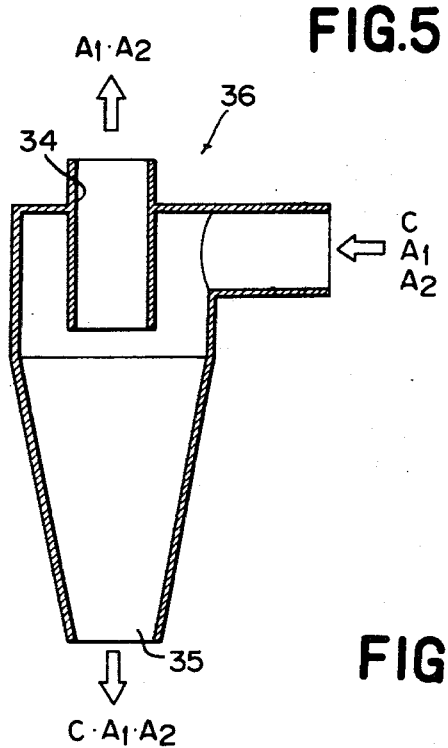
FIG.5
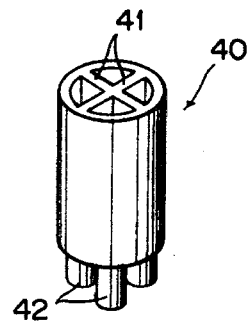
FIG.7
FIG.6
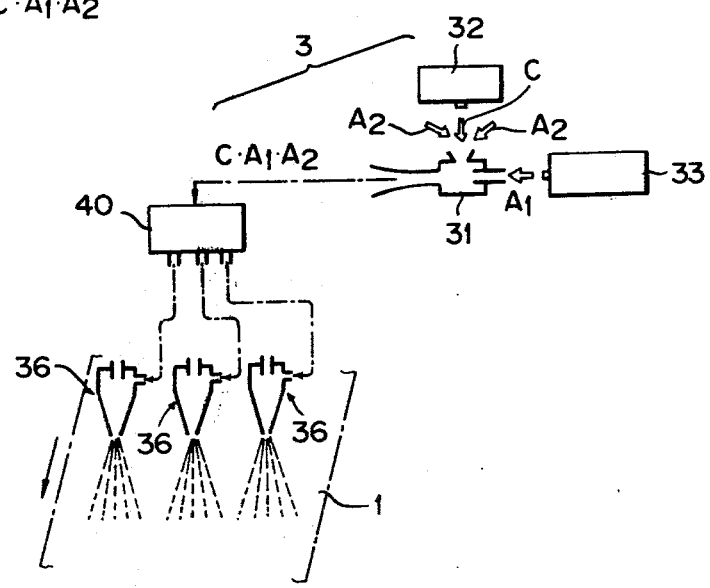

PROCESS FOR THE PRODUCTION OF PHOTOSENSITIVE PLATES FOR PRINTING

This invention relates to the preparation of a photosensitive plate for printing.

Heretofore, there has been employed a technique (named a vacuum contacting method) wherein an original film is contact-printed on photosensitive plate for printing (which will be referred hereinafter as a photosensitive plate) by placing the film and the photosensitive plate laid between the glass plate and a rubber sheet of vacuum printing frame and then evacuating the space between the glass plate and the rubber sheet to contact the film and the photosensitive plate closely. Also, there have been proposed various methods wherein a satisfactory contacting can be accomplished in a relatively short time over the whole surfaces to be contacted. More specifically, Japanese Patent Provisional Publication No. 125805/1975, for instance, discloses a photosensitive plate for printing having a matt layer coated over the surface thereof, which may improve the vacuum contacting property. However, the matt layer coated over the photosensitive surface tends to prevent a developer from penetration and decreases the developing property. A residual portion of the matt layer in image area after development tends to inhibit an affinity for ink and further the matt layer frequently tends to be dissolved in the developer so that the developer is exhausted. Japanese Patent Provisional Publication No. 11110/1976 discloses a photosensitive plate having a finely-patterned coated layer, which may improve in adverse effect upon a developing property (delay in development), as compared with the above-mentioned matt layer method. However, the finely-patterned coated layer when developed with an exhaused developer tends to be incompletely removed thereby even the non image portion is printed out (this phenomena is called tinting), a large amount of a binder or a matt agent is required for satisfactory vacuum contacting property, a developer tends to be exhausted and, moreover, equipments and steps for the coated layer are complicated so as to increase the coating and a coated layer with fine patterns sometimes may not be coated depending upon the composition, thickness and surface properties of a photosensitive layer. Also, Japanese Patent Provisional Publication No. 98505/1976 discloses a method for coating a wax- or fine powder resin having a mold releasing property in order to avoid contaminating of an original film with a coated layer for improving the vacuum contacting property. However, such a coated layer is liable to fall off the surface of a photosensitive plate for printing without tight adherence thereto and, if uniformly coated over the whole surface for tight adherence, there are found disadvantages of not only inhibiting penetration of a developer, but also of increased coating cost due to complicated equipment and steps for coating the wax- or fine powder resin and troublesome maintenance and control in its preparation.

On the other hand, "Japan Printer", Vol. 53(10), 23 (1970) by Inoue and Iino and "Printing Information", Vol. 33(11), 90 (1973) by Ishiyama et al. disclose a method wherein a solid powder, e.g., talc is spread and adhered onto the surface of a photosensitive layer of a photosensitive plate for printing by mechanical means prior to contactprinting step (named "powdering"). Such powdering may improve the vacuum contacting property by the simple procedure of merely spreading an anti-offset powder for printed matters or commercially available talc powder with a spray gun or puff and also solve the problems of a developing property, tinting, preparation as seen in the above-recited prior art. However, the powdering may simultaneously show the following drawbacks: Namely, the powdering is generally and frequently applied when the photosensitive plate and hence working environment is polluted with spread solid powder in a processing room and various inconveniences are produced in a processing step, which are not favourable from the standpoint of environmental hygiene, and it is also not to be disregarded that cleaning of machinery should be efficiently effected for the powdering step. Further, the solid powder over the powdered photosensitive plate for printing tends to fall off during handling, which leads to environmental pollution and no production of expected vacuum contacting property.

Under such circumstances, we have made earnest studies on a heat-deposit method for fixing the dispersed solid powder on the surface of a photosensitive plate for printing with the intention of avoiding the abovementioned disadvantages in the prior art.

As a result, it has been found that, where the fine powder to be deposited is not uniformly dispersed and adhered onto the plate surface, the vacuum contacting property in the resultant photosensitive plate is not improved and printing characteristics could be adversely affected, thereby there are not produced photosensitive plates with a uniform quality. Namely, by the dispersion with spray gun, puff or well-known dust supplier, it has been difficult to keep constant the amount of the solid powder to be adhered so that the expected vacuum contacting property may be sometimes unavailable and reproducibility of smaller dots has been diminished.

This invention has been completed upon the above-stated findings.

The primary object of this invention is to provide a process for preparing a photosensitive plate which has a solid powder to improve the vacuum contacting property tightly deposited onto the surface of the said photosensitive plate without any falling of the said powder during handling as seen in the prior powdering.

Another object of this invention is to provide a process for preparing a photosensitive plate wherein a photosensitive plate having a superior vacuum contacting property can be prepared without any adverse effect on its printing properties.

The other object of this invention is to provide a process for preparing a photosensitive plate wherein a depositable fine powder for improving the vacuum contacting property can be efficiently and uniformly dispersed and adhered onto the surface of the photosensitive plate, which is continuously run, in the step of adhesion of said powder onto said plate.

A further object of this invention is to provide a process for preparing a photosensitive plate wherein a solid powder can be deposited in a uniform amount onto the surface of a photosensitive plate and a printing plate can be prepared with a uniform quality.

The other object of this invention is to provide a process for preparing a photosensitive plate with an inexpensive production cost.

The other object of this invention is to provide a process for preparing a photosensitive plate wherein a large number of photosensitive plates for printing with a uniform quality can be continuously produced with easy maintenance.

These objects and other objects which may be mentioned hereinbelow can be attained according to the present process which comprises providing a depositable fine powder from a dust supplier directly or via a distributor to a cyclone in a given amount, flowing out the said powder together with a small volume of air in a given amount from the bottom of the said cyclone, uniformly dispersing and adhering the so flowed fine powder onto the surface of a continuously running photosensitive plate.

Then the dispersed powder may be treated so as to be fused onto the surface by, for example, contacting the right side of the said plate with a heating roll having a good releasing property.

The process of this invention is illustrated in the attached drawings and some preferred embodiments of this invention with which the present process can be practiced by referring to the drawings.

In the drawings wherein like reference numerals designate like parts throughout the following views:

FIG. 5 is a vertical sectional view of a cyclone which may be employed in this invention;

FIG. 6 is a schematic diagram outlining another representative supply and adherence step for a fine powder which may be employed in this invention; and FIG. 7 is a diagonal view of a distributor which may be, if necessary, employed in the fine powder supply and adherence step of this invention.

Figure 1:
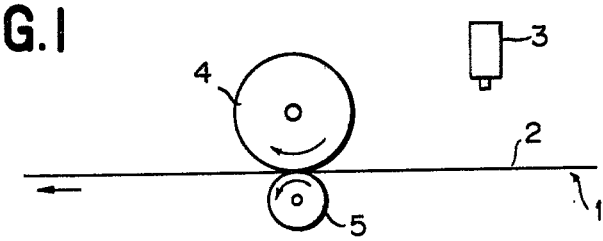
FIG. 1 and FIG. 2 shows schematic diagrams outlining four representative embodiments for practicing the present process for preparing a photosensitive plate, respectively.

Referring now to FIG. 1, there is illustrated one preferred embodiment of the present process. Onto the surface 2 (the side containing a photosensitive layer) of a running photosensitive plate 1 is provided a heat-depositable fine powder having a constant directional size in a given amount by the use of the undermentioned dust dispersion supplier 3 to achieve uniform dispersion and adhesion. Then, the plate is passed between a heating roll 4 having a good releasing property and a good insulating and elastic pressure contacting roll 5 (its diameter may be the same or different than that of said heating roll and so forth), during which the right side 2 of said plate 1 is pressure contacted with said heating roll 4. Thus, the heatdepositable fine powder uniformly dispersed and adhered on the plate surface 2 is fused and deposited on the plate surface 2.

Figure 2:
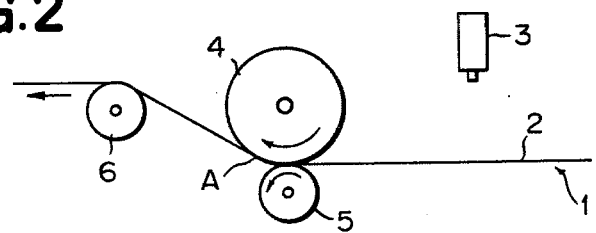

Referring to FIG. 2, there is illustrated another preferred embodiment of the present process. This embodiment is that a roll 6 (preferably with a good insulating property) is additionally placed to the embodiment as shown in FIG. 1 so that the surface of the plate passed between the heating roll 4 having a good releasing property and the good insulating pressure contacting roll 5 can be much more contacted with the heating roll 4 (at the place indicated with signal A), whereby a contacting area of the plate surface with the heating roll can be enlarged.

Figure 3:
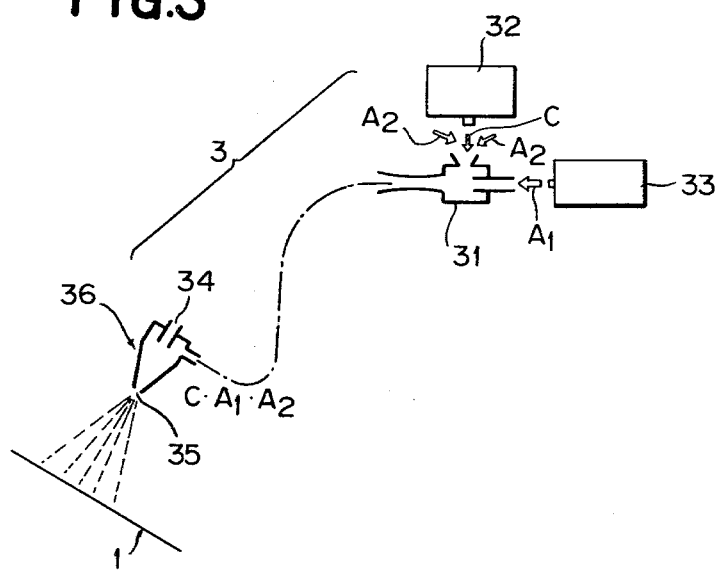
FIG. 3 is a schematic diagram outlining one representative supply and adherence step for a fine powder which may be employed in this invention.

The dust dispersion supplier 3 which may be employed in this invention is constructed with, as indicated in FIG. 3, a powder supplying apparatus 32 which provides an ejector 31 with a heat-depositable fine powder having a specified grain size; and ejector 31 which disperses the fine powder C provided in a given amount from said apparatus 32 with a pressure air $A_1$, $A_1$ being fed in a given volume from a pressure air supplier 33, in the air $A_1$ and an air $A_2$ simultaneously taken in; and a cyclone 36 which receives the fine powder C dispersed in the air $A_1$ and $A_2$ from the said ejector 31, separates the fine powder C from the air $A_1$ and $A_2$, discharges the greater volume of the air $A_1$ and $A_2$ from an exhaust part 34 and simultaneously flows out the fine powder C together with a small volume of the air $A_1$ and $A_2$ in a given amount from a bottom outlet 35.

Figure 4:
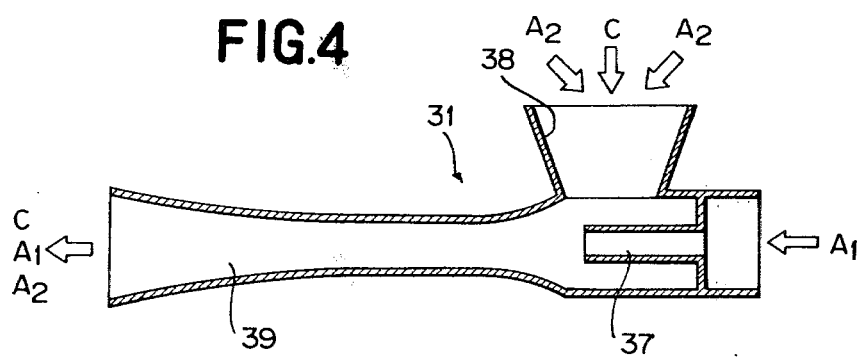
FIG. 4 is a vertical sectional view of an ejector which may be employed in this invention.

More illustratively, as further shown in FIG. 4, the ejector 31 which may be employed in this invention can take in a several times volume of the air $A_2$ than $A_1$, together with the fine powder C fed in a given amount from the apparatus 32, from an inlet 38 when the pressure air $A_1$ is introduced into a high pressure air injection nozzle 37 in the ejector 31 from a pressure air supplier 33 (exemplified, for example, by a compressor and so on). Consequently, it is sufficient to introduce into the ejector 31 the pressure air $A_1$ in a volume several times as small as that of the air $A_1$ and $A_2$ required for airconvey of the fine powder C. Thus, there may be given advantages that an equipment is satisfactory with a smaller output and that the fine powder C drawn with the intake air $A_2$ can be more uniformly dispersed by impact mixing developed with the fed air $A_1$ and the introduced air $A_2$ at a diffuser 39 within the ejector 31.

The cyclone 36 which may be employed in this invention can separate the fine powder C from a greater volume of the air $A_1$ and $A_2$ supplied from the ejector 31 and discharge the said volume of air from an upper exhaust part 34, as shown in FIG. 5, and thus flow out the fine powder C together with an extremely smaller volume of the air $A_1$ and $A_2$ from a bottom outlet 35 (usually a conical opening) in the cyclone. Then, the air $A_1$ and $A_2$ having the fine powder C dispersed therein can be injected at a lower air-speed from the bottom outlet 35 and the fine powder C can be spread over the plate surface in a uniformly dispersed state so that the fine powder can be uniformly adhered onto the plate surface. In addition, a large volume of the air $A_1$ and $A_2$ can be discharged from the outlet 34 and thus a sufficient volume of the air $A_1$ and $A_2$ can be utilized for conveying the fine powder C from the ejector 31 to the cyclone 36. For instance, even if a wind tunnel is employed for such convey, the fine powder may be advantageously fed to the cyclone 36 from the ejector 31 without any adhesion of the fine powder on the inner surface of the wind tunnel and so without any loss in the fine powder amount.

In practicing the present process, when a uniform amount of a heat-depositable fine powder is to be adhered onto a photosensitive plate for printing with a relatively broader width, a plural numbers of the said cyclone 36 may be arranged so as to adhere a uniform amount of the fine powder on the plate surface. In such a case, each cyclone 36 may be connected in parallel with the ejector 31, the dust supply apparatus 32 and the pressure air supplier 33 one by one, but it is convenient as shown in FIG. 6 that a distributor 40 is inserted between the ejector 31 and the cyclone 36, 36, 36 . . . and the fine powder C dispersed in the air $A_1$ and $A_2$ from the ejector 31 is divided by the distributor 40 and then fed into each cyclone 36, 36, 36 . . . . Illustrative example of the distributor which may be used herein is the one as shown in FIG. 7, which divides the fine powder C dispersed in the air $A_1$ and $A_2$ from the ejector 31 into equal portions by a partition 41 and then discharges from an outlet 42, and there may be used other types of distributors, for example, that of being capable of dividing the fine powder C and the air $A_1$ and $A_2$ at equal ratios. Plural numbers of the cyclone 36 as mentioned above may be optionally arranged to adhere a uniform amount of the fine powder onto the plate surface, for example, in a right-angled manner to a running direction of the plate, in a zigzag manner or in a diagonal manner.

The heat-depositable fine powder which may be employed in this invention may be any of those that is depositable by heating onto the surface of the right side of a photosensitive plate after the dispersing thereonto. The heat-depositable fine powder comprises preferably solid powder substantially composed of a substance or composition that has a lower first transition point or second transition point than the first transition point of a photosensitive layer or a solid powder having a surface layer substantially composed of the said substance or composition, and it is more preferable that the first and second transition points of the said substance or composition 40° C. or higher and the first or second transition point of the said substance or composition is lower than the first transition point of the photosensitive layer. Further, there may be employed in this invention any heat-depositable fine powder having a higher first transition point than that of the photosensitive layer, since only the heat-depositable fine powder dispersed onto the surface of a photosensitive plate is rapidly heated and fused without heating the whole photosensitive plate to an elevated temperature.

In the present invention, the term "first order transition point" means a Vicat softening point, which can be tested according to ASTM designation D.1525-70, and the term "second order transition point" means a generally known glass transition point, which can be tested according to, for example, the description on pages 43 to 45 of "Textbook of Polymer Chemistry" by Fred W. Billmeyer, Jr. (Interscience Publishers, Inc., New York, 1957).

Preferable examples may include polyvinyl acetate, polyvinylidene chloride, polyethylene oxide, polyethylene glycol, polyacrylic acid, polymethacrylic acid, polyacrylamide, polymethacrylamide, polyacrylate such as polybutylacrylate, polymethacrylate, polystyrene and derivatives thereof, and copolymers of monomers of these polymers, polyvinyl methyl ether, epoxy resins, phenol resins, polyamides, polyvinyl butyral, etc.

The heat-depositable fine powder which may be employed in this invention is preferably one that is soluble in a developer; Two types of developer are usually used. One is an aqueous strong alkali solution, e.g., silicates and the other is an organic solvent such as alcohols, glycols, ketones. Additionally, there may be employed any matt agents well-known to be commonly used for coarsening a surface of a material, (for example, fine solid powder of silica, zinc oxide, titanium oxide, zirconium oxide, alumina, polymethyl methacrylate, polystyrene, phenol resins and the like), the surface of which is covered with the above-mentioned heat-depositable fine powdery material.

The heat-depositable fine powder which is supplied over the surface of a photosensitive plate should have a constant directional size of $0.5-40\mu$, more preferably $1-17\mu$. Namely, if the heat-depositable fine powder has a constant directional size of less than $0.5\mu$, an improved vacuum contacting property is hardly observed, while, if the size is more than $40\mu$, reproducibility of smaller dots is diminished.

In order to make uniform the grain size of the fine powder within the above-defined range, there may be applied any well-known classification techniques. Also, there is no particular restriction upon the shape of a heat-depositable fine powder to be employed, provided that the above-defined directional size range is maintained. For example, one may utilize a spherical shaped powder, an amorphous powder formed by gringing with a ball mill, a jet mill or the like.

An amount of the heat-depositable fine powder to be supplied over the surface of a photosensitive plate for printing in this invention should be such that $0.005-0.5$ g./m² of the powder be uniformly spread and deposited over the surface of a photosensitive plate for printing. After all, if less than $0.005$ g./m² of the powder is deposited, a vacuum contacting property can not satisfactorily be improved, while if more than $0.5$ g./m² applied, reproducibility of smaller dots is diminished. According to the present process, the heat-depositable fine powder uniformly dispersed and adhered onto the plate surface at the above-defined ratio can be heat-deposited onto the surface of the plate by contact with the heating rolls in an amount substantially equal to the amount which was dispersed onto the plate. For uniform dispersing and adherence of the heat-depositable fine powder onto the plate surface at the above-mentioned ratio in the present process, there may be favourably applied the cyclone as described herein.

The heating rolls having a high releasing surface which may be employed in the present process are to act as heat-depositing the heat-depositable fine powder uniformly dispersed and adhered onto the plate surface at the said ratio, by contacting therewith and may be any of those wherein the said powder does hardly adhere to the surface of the said roll. As examples thereof, one may employ known heating rolls lined with a fluororesin, e.g., "Teflon" (tradename) over the surface thereof, heating rolls having a coarse surface impregnated with a fluororesin, heating rolls covered with a tube made of a thermoshrinking fluroresin such as a tetrafluoroethylene-hexafluoropropylene copolymer, heating rolls made of a silicone resin and the like. It is convenient that the thickness of such high releasing resin layer as the said fluororesin, silicone resin layers is not less than $100\mu$ to facilitate control of heat transfer when the said fine powder heat-deposited. Also, it is not preferable that the layer be too thick in view of possible thermal efficiency, while it is preferred that the heating rolls having a high releasing surface have a smooth surface.

As explained hereinabove, the present process can be accomplished by heat-depositing onto the plate surface a heat-depositable fine powder uniformly dispersed and adhered over the said plate surface through contacting the said plate surface with such heating rolls having a high releasing surface. The heat-deposit in the present invention is meant to have the deposited fine powder fixed at such a strength that the said powder can not easily fall off by various contacts encountered during conventional process steps. It is particularly preferred that the powder is fixed such that an unfavourable foreign material when adhered onto the surface of a photosensitive plate may be removed, while the deposited powder may remain deposited, by sweeping with clothes or like means. Consequently, the heating temperature with heating rolls may be satisfactorily within the range requisite and sufficient to fuse the fine powder and fix it onto the plate surface at the above-defined ratio and then appropriate temperature may be selected depending upon the preheating temperature of the plate by the said preheating rolls 4A, the sort, melting point and amount of the fine powder to be heat-deposited, the type of photosensitive plate for printing and the like.

The heating temperature of heating rolls employed in this invention may be properly selected as depicted above, but preferably it should be selected so that the surface temperature of the plate be within the following temperature range immediately after leaving the said heating rolls: Namely, it ranges from the second transition point of the fine powder applied through a temperature obtained by adding 100° C. to the first transition point of the fine powder.

As photosensitive materials to be coated on supports, there may be used any materials so long as they change in their solubility or swelling property relative to developers by means of exposure. Particularly preferable as the photosensitive materials are photosensitive compositions comprising diazo compounds, e.g. diazo resins and shellac (Japanese Laid-Open-to-Public Publn. No. 24404/1972), those comprising poly(hydroxyethylmethacrylate) and diazo resins, and diazo resins and soluble polyamide resins (U.S. Pat. No. 3,751,257), those comprising photosensitive products of azide and epoxy resins (U.S. Pat. No. 2,852,379), and photosensitive compositions which are useful as negative working type photosensitive compositions capable of becoming insoluble by the action of actinic ray, said compositions comprising photosensitive resins having in such a molecule, e.g., polyvinyl cinnamate at least two unsaturated double bonds and which dimerize when irradiated by actinic ray to become insoluble, such as photosensitive products of azide, diazo resins, etc., for instance, derivatives of polyvinyl cinnamate as disclosed in the specifications of British Pat. Nos. 843,543 and 966,297 and U.S. Pat. No. 2,725,372, prepolymers of diallyl phthalate as disclosed in U.S. Pat. No. 3,462,267 and such ethylenically unsaturated compounds as having in the molecule at least two unsaturated double bonds and bringing about polymerization reaction on irradiation of actinic ray as disclosed in Japanese Patent Publication No. 8495/1960, and a suitable binder, for example, polyvinyl alcohol or such compounds being derivatives of cellulose and having on the side chain carboxy groups, e.g. polyvinyl-H-phthalate and carboxymethylcellulose, or copolymers of methyl methacrylate and methacrylic acid. The aforesaid ethylenically unsaturated compounds disclosed in Japanese Patent Publn. No. 8495/1960 include unsaturated esters of polyol, e.g. ethylenediacrylate, diethyleneglycoldiacrylate, glyceloldiacrylate, glyceloltriacrylate, ethylenedimethacrylate, 1,3-propylenediacrylate, 1,4-cyclohexanediolacrylate, 1,4-benzenedioldiacrylate, pentaerythritoltetraacrylate, 1,3-propyleneglycoldiacrylate, pento-1,5-dioldimethacrylate, pentaerythritoltriacrylate, bisacrylate and methacrylate of polyethylene glycol having molecular weight of 50 to 500, unsaturated amides, particularly amide of α-methylenecarboxylic acid and α,ω-diamine and ω-diamine having intermediary oxygen, e.g. methylenebisacrylamide and diethylenetriaminetrisacrylamide, divinyl succinate, divinyl adipate, divinyl phthalate, divinyl terephthalate, divinylbenzene-1,3- disulfonate, or such a corresponding compound that contains methacrylate or methacrylamide instead of acrylate or acrylamide in the above-mentioned compounds respectively, etc. Useful as positive working type photosensitive compositions are those which comprise such matters as disclosed in U.S. Pat. Nos. 3,635,709, 3,061,431 and 3,061,120, photosensitive products of o-diazo oxide type, phosphotungstates of diazo resins (Japanese Patent Publn. No. 7663/1964), and potassium ferrocyanide of diazo resins (U.S. Pat. No. 3,113,023). Furthermore, such photosensitive compositions containing linear polyamides and monomers having addition polymerizable unsaturations as disclosed in the specifications of U.S. Pat. Nos. 3,081,168, 3,486,903, 5,512,971 and 3,615,629 are also useful.

As the support of the photosensitive plate of the present invention, there may be, for example, employed preferably an aluminum plate, a composite sheet having an aluminum sheet bonded on a polyethyleneterephthalate film as disclosed in Japanese Patent Publication No. 18327/1973 and the like when a lithographic printing plate is applied, while an aluminum plate, an iron plate and the like when a typographic printing plate is applied. Said support may include those layers which have been surface-treated by well-known methods and may have any subbing layer. Further, the photosensitive layer provided on a support may be any of such well-known layers wherein a photosensitive material may show changes in solubility or wettability to a developer before and after exposure.

Accordingly, the present invention facilitates control of the heating temperature requisite for the above heat-deposit precisely, and heating the said plate gradually and slowly, as compared with the case of a heating rolls only.

This invention will be more fully illustrated by way of the following example.

EXAMPLE

A styrene-acrylic acid-butyl acrylate (45:30:25) copolymer was pulverized and then classified by the use of a zigzag classification apparatus manufactured by Alpime Co., Ltd. to prepare heat-depositable fine powder having a constant directional size of 0.5–40μ.

The fine powder thus prepared was uniformly dispersed and adhered, by the dust dispersion supplier 3 as indicated in FIG. 5, onto the surface of a publicly-known photosensitive plate for printing (SAKURA PS plate SLP, a thickness of 0.3 mm) which was continuously run at a constant speed of 10 m/min. Namely, the said fine powder was supplied at a ratio of 0.005 g. per m² of the said photosensitive plate to an inlet part 38 of the ejector 31, while a pressure air at 2 kg/cm² was fed at 180 l/min. into a high-pressure air injection nozzle 37. At this moment, an air of 320 l/min. was taken in together with the said fine powder from the inlet part 38. The air having dispersed therein said fine powder at 500 l/min. was divided into 4 portions by the use of the distributor 40, each portion was introduced into each of 4 parallel cyclones 36, 36, 36 . . . and continuously flowed out from the bottom outlet 35 thereof to accomplish a uniform dispersion and adhesion of said fine powder on the plate surface.

Thereafter, the plate was passed between a heating roll 4 and a pressure contacting roll and continuously conveyed on a roll 6 as indicated in FIG. 2. More specifically, the heating roll used was covered with a heat-shrunk tube of a tetrafluoroethylene-hexafluoropropylene copolymer and of a thickness of 0.5 mm, the surface temperature of the said roll was maintained at 110° C., while the contact pressure between the said roll 4 and the said insulating, elastic roll 5 was adjusted to 1.2 kg. per 1 cm. width of the said plate. After passing between both rolls, the said plate had contacted the heating roll 4 over a contact length of 70 mm (as shown with signal A in FIG. 2), whereby the said fine powder was heat-deposited onto the surface of the said plate to prepare the sample according to this invention.

The resultant photosensitive plate for printing (the above sample) required only 1 minute and 10 seconds for vacuum contact upon contact printing, whereas a photosensitive plate before the treatment of this invention took 2 minutes and 20 seconds.

For contact printing herein, a photographic film (500×700 mm) having 20% dotted image and formed with Sakura OL-100 E film was subjected to vacuum contact with the sample (800×1003 mm) by the use of a horizontal vacuum printing frame, KD-P1 type printing frame, available from Kamodenki Kenkyusho, Japan.

The above present photosensitive plate sample and a photosensitive plate not treated according to this invention were exposed for 3 min. to a 2 KW metal halide lamp at a distance of 5/4 m and then developed by dipping in a 1% aqueous solution of sodium tertiary silicate for 45 seconds. The heat-deposited fine powder gave a positive image just as an original negative did without any influence upon development.

Printing performance upon printing was completely equivalent in both printing plates. Namely, no influence was observed on development and printing performance (in both imaged line and non-imaged line portions) owing to deposit of the heat-depositable fine powder on the surface of the said plate.

Then, the same procedures as in this example was repeated except that a heat-depositable fine powder which was uniformly spread and adhered onto the plate surface had a constant directional size of more than $40\mu$ or of less than $0.5\mu$. In the case of the more than $40\mu$ size, reproducibility of smaller dots was diminished and insufficient improvement in vacuum contacting property was observed when the less than $0.5\mu$ size was used.

We claim:

1. A process for the production of a photosensitive plate for printing which comprises:
   feeding a volume of air containing a given amount of a fine powder having a constant directional size of $0.5-40\mu$ to at least one cyclone;
   downwardly discharging from the bottom of said cyclone said given amount of said fine powder together with a volume of air which is small relative to the volume of air fed to said cyclone; and
   uniformly dispersing and adhering the discharged fine powder onto the surface of the side of a photosensitive plate which contains a photosensitive layer which is continuously moving past said cyclone.

2. The process of claim 1, wherein said powder is a heat-depositable fine powder and is supplied in a given amount to an ejector from a powder supplier; and said volume of air fed to said cyclone is air under pressure which is first fed to said ejector simultaneously with said fine powder to disperse said fine powder in said air under pressure, said air with said dispersed fine powder being fed to said cyclone.

3. The process of claim 1 further comprising heating said photosensitive plate to fuse said fine powder onto said surface of said photosensitive plate after said fine powder is dispersed onto said surface.

4. The process of claim 3 wherein the heating is effected by contacting said side of the said photosensitive plate with a heating roll.

5. The process of any one of claims 1-4 wherein said volume of air containing said fine powder is fed directly to said at least one cyclone.

6. The process of any one of claims 1-4 wherein said volume of air containing said fine powder is fed to said at least one cyclone via a distributor.

* * * * *